United States Patent [19]

Huang

[11] Patent Number: 4,772,335
[45] Date of Patent: Sep. 20, 1988

[54] PHOTOVOLTAIC DEVICE RESPONSIVE TO ULTRAVIOLET RADIATION

[75] Inventor: Wingo C. Huang, Shaker Heights, Ohio

[73] Assignee: Stemcor Corporation, Cleveland, Ohio

[21] Appl. No.: 108,920

[22] Filed: Oct. 15, 1987

[51] Int. Cl.$^4$ ............................................ H01L 31/02
[52] U.S. Cl. .................................. 136/258; 136/256; 357/30
[58] Field of Search ......... 136/256, 258 AM, 258 PC; 357/30 K, 30 Q

[56] References Cited

U.S. PATENT DOCUMENTS

| | | | |
|---|---|---|---|
| 4,476,346 | 10/1984 | Tawada et al. | 136/249 |
| 4,527,006 | 7/1985 | Yamazaki | 136/244 |
| 4,598,164 | 7/1986 | Tiedje et al. | 136/249 |
| 4,642,413 | 2/1987 | Ovshinsky | 136/249 |
| 4,681,984 | 7/1987 | Moeller | 136/258 |

OTHER PUBLICATIONS

A. D. Wilson, H. Lyall, "Design of an Ultraviolet Radiometer, 1: Detector electrical characteristics" *Applied Optics*, (Dec. 1986) pp. 4530–4539.
A. D. Wilson, H. Lyall, "Design of an Ultraviolet Radiometer, 2: Detector Optical Characteristics" *Applied Optics*, (Dec. 1986) pp. 4540–4546.
Rahman, et al. "Amorphous/Crystalline Heterostructure as a novel approach . . . ", *Electronics Letters*, (Jan. 1984) pp. 57–58.
K. Takahashi et al. "Amorphous Silicon Solar Cells", J. Wiley, 1986, pp. 141–148.
Tsuda et al., High-Quality a-Si-Based Alloys: a-SiGe Films Fabricated in a Super Chamber and Superlattice Structure a-Si Films Prepared by a Photo-CVD Method, (1987) vol. 95, Mat. Res. Soc. Symp. Proc., pp. 311–316.

*Primary Examiner*—Aaron Weisstuch
*Attorney, Agent, or Firm*—Jeffrey A. Wyand; Joseph G. Curatolo; Larry W. Evans

[57] ABSTRACT

An improved, low cost photovoltaic device responsive to ultraviolet radiation includes a body of amorphous silicon having a front contact formed of a thin film of a transparent, electrically conductive oxide. In order to achieve desired quantum efficiencies in the spectral region from 200–400 nm, the oxide film is less than 50 nm in thickness and most preferably is about 15 to 30 nm in thickness. A metallic current collector may be disposed on part of the oxide film to reduce resistive losses in current collection. The amorphous silicon body may include a P-I-N structure or a doped film disposed on an oppositely doped crystalline silicon layer. In some embodiments of the device, the amorphous silicon region or body disposed in contact with the oxide film is preferably microcrystalline silicon.

29 Claims, 4 Drawing Sheets

PHOTOVOLTAIC DEVICE RESPONSIVE TO ULTRAVIOLET RADIATION

BACKGROUND

Ultraviolet light detectors have become of increasing importance with the development of short pulse lasers producing electromagnetic radiation in the ultraviolet or near ultraviolet wavelength region of the electromagnetic spectrum.

Crystalline silicon ultraviolet detectors are known. Those detectors typically include an intrinsic, i.e., effectively undoped, region sandwiched between oppositely doped, i.e., one p-type and one n-type, layers. The light to be detected enters through one of the doped regions and some of the unabsorbed light that reaches the intrinsic region produces charge carriers that are collected as an indication of the presence of ultraviolet light. The response and efficiency of these crystalline detectors is limited by the quantity of light absorbed in the "front" doped region through which the light must pass in order to reach the intrinsic region. In order to achieve the doping level necessary for good performance, that "front" doped region must have a thickness of several hundred nanometers (nm). But the strong absorption of ultraviolet light in a crystalline front region of that thickness limits the quantum efficiency of crystalline silicon detectors. In addition, crystalline silicon detectors show some instability after exposure to ultraviolet light.

To overcome the quantum efficiency limitations in crystalline silicon ultraviolet light detectors, materials other than silicon are employed in some ultraviolet detectors. For example, Schottky barrier ultraviolet light detectors employing gallium arsenide phosphide are commercially available. However, these alternative material photovoltaic detectors of ultraviolet light are expensive because of the materials employed.

Other ultraviolet light detectors are also known. A summary of the state of the art appears in two articles by Wilson and Lyall published in 24 *Applied Optics* 4530–4546 (December 1986). None of the available detectors achieves low cost, long term stability and high efficiency.

Accordingly, it would be useful to provide a low cost, high efficiency, solid state photovoltaic detector of ultraviolet radiation that is stable over time.

SUMMARY OF THE INVENTION

In the invention a solid state, photovoltaic detector of ultraviolet radiation employs a body of amorphous silicon. Electrical contacts are disposed on opposite sides of the structure, including, on the light incident side, a thin, electrically conductive light-transmissive film of an electrically conducting oxide, such as tin oxide or indium oxide doped with tin. In order to maximize quantum efficiency, the oxide film is no thicker than about 50 nm and, most preferably, is about 15 to 30 nm thick.

In one embodiment, the amorphous silicon body includes a P-I-N structure. In that embodiment, the doped amorphous silicon region adjacent the oxide film is only tens of nanometers thick so that little ultraviolet is lost in the doped front region. As a result, detector efficiency is improved, even over that achieved with exotic materials such as gallium arsenide phosphide. Preferably, the front doped layer is a doped microcrystalline form of amorphous silicon.

A P-I-N photovoltaic detector according to the invention may be disposed on a glass substrate coated with a conductive tin oxide film as a back contact or may be directly disposed on an electrically conducting substrate, such as a metal, a metallic alloy like stainless steel, or silicon, that forms the back contact. Because of the relatively strong absorption by amorphous silicon of ultraviolet light, the light-absorbing intrinsic region need be no more than about 250 nm in thickness, but may be thicker.

An encapsulated embodiment of the invention includes a header or other support on which a P-I-N amorphous silicon photovoltaic detector is disposed. The header provides the back electrical contact and an oxide film provides the front electrical contact. This embodiment is prepared by depositing the oxide film on a quartz substrate and then attaching the detector to a header for encapsulation.

In yet another embodiment of the invention, the amorphous silicon body is a doped film disposed on a crystalline silicon layer of the opposite conductivity type. Because the amorphous silicon film absorbs less ultraviolet light than a crystalline counterpart, the sensitivity is enhanced over that of a totally crystalline detector.

In the invention, because of the extreme thinness of the front oxide layer, it is important that the oxide have a relatively low resistivity. In addition, it is desirable to deposit a highly conductive, metallic current collection layer on a portion of the oxide layer. The optical transmission characteristics of the oxide film can be altered by depositing on it another film or films of transparent materials such as silicon dioxide, silicon nitride, magnesium fluoride or calcium fluoride.

BRIEF DESCRIPTION OF DRAWING FIGURES

Figure 5:
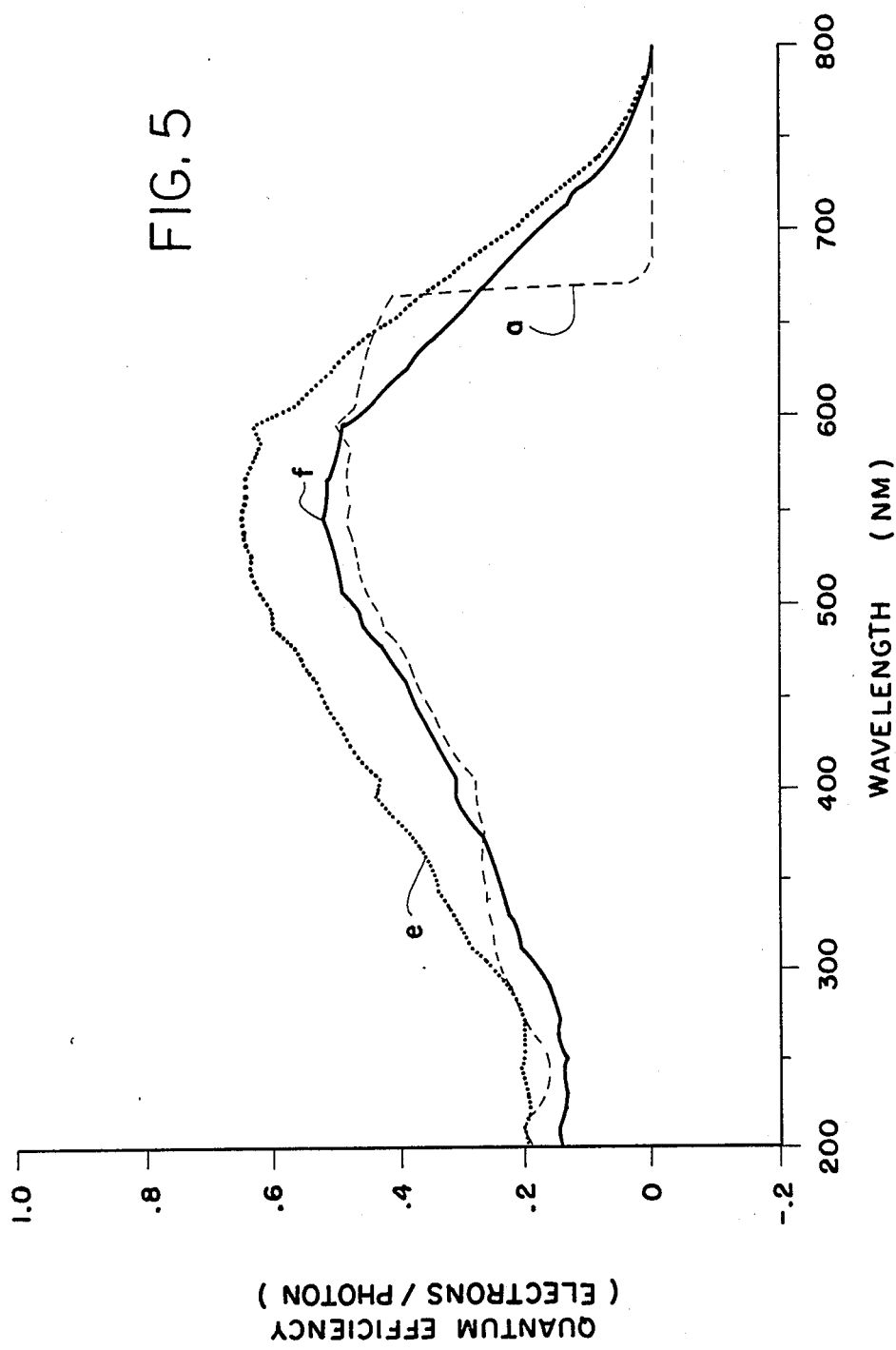
Figure 6:
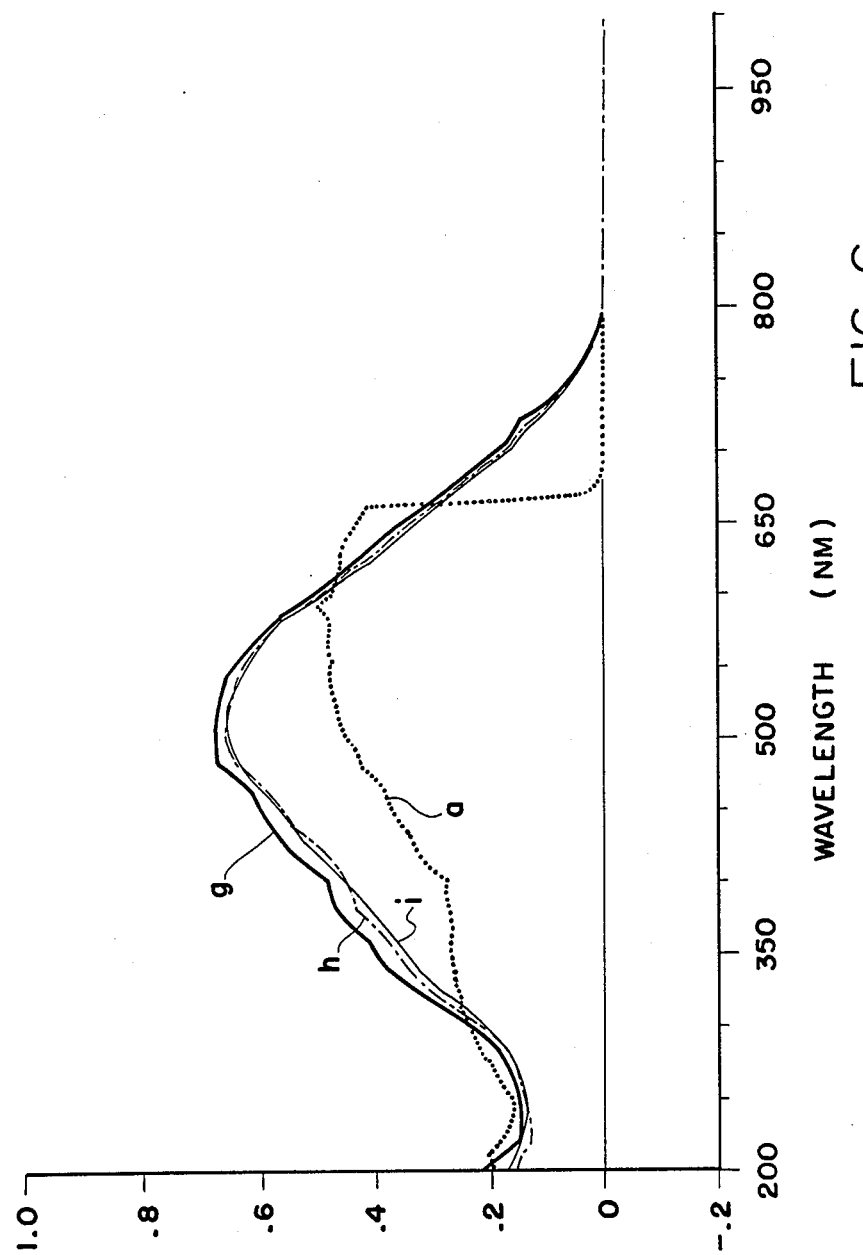

FIG. 5 is a graph of the quantum efficiency of a device according to the invention and having a relatively thick light-absorbing layer, before and after exposure to sunlight and of a reference ultraviolet responsive device; and FIG. 6 is a graph of the quantum efficiency as a function of wavelength of a device according to the invention and having a preferred thickness light-absorbing layer, before and after exposure to sunlight and ultraviolet light and of a reference ultraviolet responsive device.

DETAILED DESCRIPTION OF THE PREFERRED EMBODIMENTS

Figure 1:
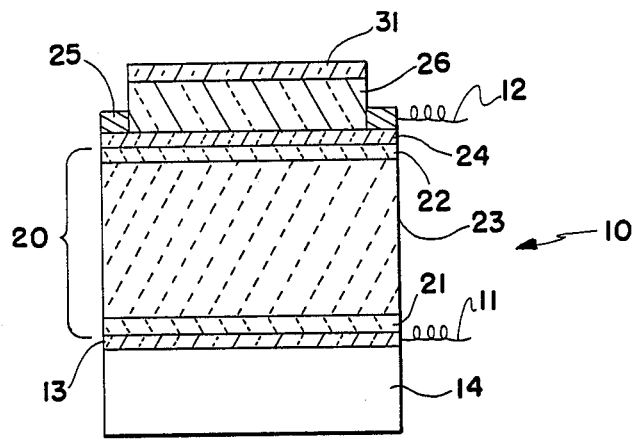
FIG. 1 is a sectional view of an ultraviolet responsive device according to the invention.
Figure 2:
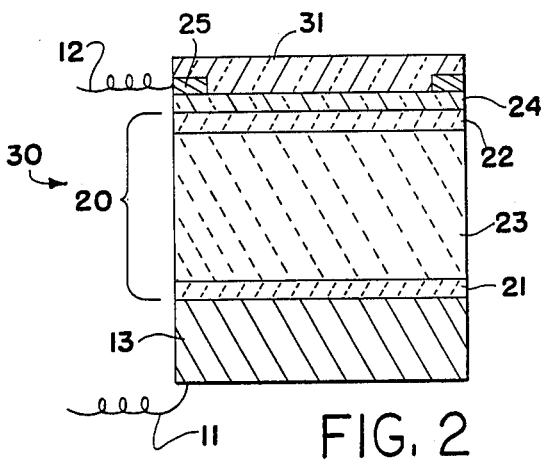
FIG. 2 is a sectional view of another embodiment of a ultraviolet responsive device according to the invention.
Figure 3:
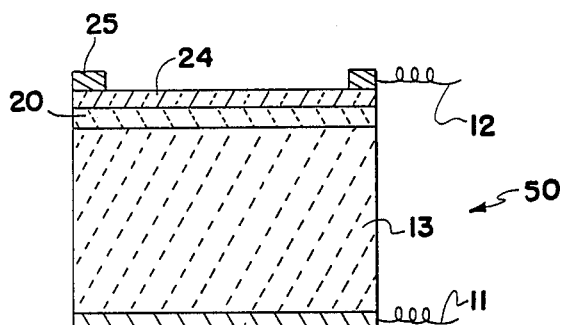
FIG. 3 is a sectional view of a third embodiment of an ultraviolet responsive device according to the invention.

Three embodiments of structures of novel photovoltaic devices responsive to ultraviolet radiation are illustrated in cross-section in FIGS. 1, 2 and 3. Each of these devices is photovoltaic. That is, each device produces an electric current and/or a voltage in response to the incidence of electromagnetic radiation, particularly in the ultraviolet portion of the spectrum. As with other photovoltaic devices, the ultraviolet responsive devices of the present invention may be operated with or without an external voltage applied. In the former case, the incidence of ultraviolet radiation is indicated by the generation of an open circuit voltage or a closed circuit current flow. In the latter case, an external voltage is impressed across the electrical contacts of the device to enhance current collection. The external voltage creates an electric field within the device that aids in collecting charge carriers produced within the device in response to the incidence of ultraviolet radiation. As used here, the term ultraviolet radiation means short wavelength light that is not visible to the naked eye, particularly in the spectral wavelength range from about 200 nm to 400 nanometers (nm).

The ultraviolet responsive device 10 of FIG. 1 includes electrical terminals 11 and 12 for external electrical contact to the device. Terminal 11 is connected to an electrically conductive layer 13 that is referred to as the back contact. The back contact lies at the deepest portion of the device with respect to the direction of incident electromagnetic energy. Layer 13 is an electrically conductive material either in the form of a film or a bulk material. For example, contact 13 may be a thin layer of tin oxide that is disposed on an electrically insulating substrate 14 that provides mechanical support. For example, substrate 14 may be glass. Substrate 14 may also be a metal header and layer 13 may be a metal alloy, an adhesive or another material that forms an ohmic contact and/or mechanical bond between substrate 14 and an amorphous silicon body 20. Alternatively, as indicated in FIG. 2, contact 13 may be a metal, a metal alloy such as stainless steel, or crystalline or polycrystalline silicon directly in contact with amorphous silicon body 20.

Amorphous silicon body 20 includes two oppositely doped regions 21 and 22 sandwiching an intrinsic region 23. Body 20 is disposed on contact 13. Regions 22, 23 and 21 are arranged serially so that incident light passes through them in that order. For clarity, FIG. 1 (and FIGS. 2 and 3) are not drawn to scale. Generally, the doped regions 21 and 22 are very thin, on the order of 10 nm. One of those regions incorporates an impurity giving it a p-type conductivity and the other region incorporates a different impurity, giving that region an n-type conductivity. Region 23 contains either no impurity or some compensating impurity that provides that region with a relatively high resistivity that may be weakly n-type or p-type in conductivity character, but substantially favors neither of those types of conductivity.

As understood in the art, the amorphous silicon described here contains hydrogen and/or another dangling bond terminating element in a sufficient concentration so that its electronic qualities are acceptable for the novel ultraviolet detector. That is, the amorphous silicon is of the same type and quality required for solar photovoltaic applications. As used here, the term amorphous silicon encompasses not only the traditional amorphous material that lacks any long-range atomic order, but also microcrystalline materials that contain tiny crystallites within a surrounding disordered matrix. Preparation of microcrystalline silicon is well known and was described, for example, by Vanier, et al. in 66 *J. of NonCrystalline Solids* 31ff (1984).

In accordance with the usual operation of an amorphous P-I-N photovoltaic structure, incident light passes through the front region, here region 22, without substantial absorption and generates charge carriers in region 23. By virtue of the built-in electric field inherently produced by the structure, or as enhanced by an external voltage applied across terminals 11 and 12, those charge carriers are attracted from region 23. Most of those light-generated carriers are collected in regions 21 and 22 and produce either a voltage at terminals 11 and 12 or a current flowing through those terminals. Generally, region 23 is substantially thicker than regions 21 and 22 because it is desired that most of the light absorption and charge generation take place in region 23. Region 23 is preferably on the order of 250 nm in thickness, but may be thicker or thinner.

Microcrystalline silicon has better light transmissivity, i.e., lower absorption, and is generally more easily doped than totally disordered silicon. Therefore, it is preferred in some embodiments of the invention that region 22, the front or window region, be microcrystalline silicon. The window region may be either p-type or n-type and may be heavily doped so as to be referred to as p+ or n+. In addition, carbon or nitrogen may be added to the window region to increase its energy bandgap. The additional element can be advantageously used to form p+ amorphous silicon carbide or n+ amorphous silicon nitride without the necessity of achieving perfect stoichiometric proportions. The increased bandgap reduces light absorption in the window region.

A thin film 24 of an electrically conducting, light-transmissive material is disposed on body 20 opposite layer 13 as a front contact. Thin film 24 is adjacent to and in touching contact with region 22 of body 20. Film 24 is referred to as the front contact since it lies at the top of the device with respect to the direction of the incident light. The function of film 24 is to provide an electrical contact for terminal 12 of the device, yet to absorb as little ultraviolet light as possible in order not to reduce the sensitivity of the device.

An appropriate material for thin film 24 is a light-transmissive, electrically conducting oxide. Preferred oxides are indium oxide doped with a metal, preferably, tin, and tin oxide. Indium tin oxide (ITO) is preferred when the oxide film is deposited after the amorphous silicon body has been deposited, because ITO can have a lower resistivity than tin oxide. However, when the device is prepared by depositing the amorphous silicon body on the front contact, a tin oxide film is preferable over ITO. Indium in an oxide film can dope or otherwise adversely affect the subsequently deposited amorphous silicon body and is preferably avoided. Conversely, depositing microcrystalline silicon on an oxide film can adversely affect the film. Therefore, when the amorphous silicon body is deposited on an oxide film, it is preferred that microcrystalline silicon not contact the oxide film.

It is important that oxide film 24 be very thin, less than 50 nm and, most preferably, about 15 to 30 nm, in thickness. Because film 24 is so thin, it is important that its electrical conductivity be as high as possible to minimize resistive losses when current flows laterally through the film. To enhance current collection and minimize resistive losses, a metallic current collector 25 is disposed on part of film 24 opposite body 20. Current collector 25 occupies as little of the surface of film 24 as possible to limit obscuring of body 20 from incident ultraviolet light. Collector 25 may be in the form of a grid or, more preferably, may be peripherally disposed around the area of the novel detector. For example, collector 25 may be annular in a device having a circular cross-section transverse to the direction of incident light.

FIG. 1 also illustrates a second embodiment of the invention that permits easy encapsulation. In FIG. 1, a glass substrate or superstrate 26 is shown lying over and in contact with film 24. Superstrate 26 must be highly transparent to ultraviolet light if the detector is to function as intended. High silica content glass, such as quartz, may be used as superstrate 26. In this embodiment, the detector is constructed in reverse order from the embodiment described above. Film 24, which, as mentioned above, is preferably tin oxide in this embodiment, is deposited on superstrate 26. Thereafter, amorphous silicon body 20 is deposited by a conventional glow discharge technique. As discussed, it is preferable in this embodiment that the region of silicon body 20 contacting film 24 not be microcrystalline. However, the amorphous silicon region contacting the oxide film may contain a bandgap increasing agent, i.e., may be amorphous silicon carbide or amorphous silicon nitride.

In this alternative embodiment of FIG. 1, substrate 14 may be a conventional semiconductor device header. Layer 13 may be an electrically conducting metal alloy or adhesive that forms an ohmic contact and mechanical bond between silicon body 20 and header 14. Alternatively, an electrically insulating mechanical bond might be formed between layer 13 and a header. Wires extending from the front and back contacts may be bonded to electrically conducting posts extending from the header.

The header mounted device can be enclosed in a container bonded to the header or encapsulated in an electrically inert material in accordance with long established processes. As discussed in more detail below in connection with FIG. 2, one or more anti-reflection transparent layers 31 may be deposited on superstrate 26 opposite film 24. Calcium fluoride and magnesium fluoride may be employed in anti-reflection films 31.

Another embodiment of an ultraviolet detector 30 according to the invention is shown in cross-section of FIG. 2. (In all figures like elements are given the same reference numbers.) In device 30, back contact 13 comprises an electrically conductive material that also provides mechanical support, i.e., is a substrate. Back contact 13 may be a metal, a metallic alloy such as stainless steel, or single crystal or polycrystalline silicon. Particularly when back contact 13 is crystalline silicon, its surface on which the amorphous body 20 is disposed may be textured or grooved to diffuse incident ultraviolet radiation that reaches the contact and is reflected from it. Since most of the incident ultraviolet light is absorbed before reaching the back contact, texturing is most effective in trapping externally incident light rather than internally reflected light. A textured or grooved substrate can produce surface features in the amorphous silicon body and oxide layer. Reflected incoming light may strike a surface of a feature one or more times improving the probability of its absorption. Texturing of a crystalline back contact may be achieved by chemically etching the contact with a preferential etch to expose crystalline planes lying at oblique angles. These etches generally produce pyramidal facets. Alternatively, grooves can be formed with chemical etching of selected areas using conventional lithographic processes.

In detector 30, a second light-transmissive film 31 has been deposited on thin film 24. The thicknesses and the respective indices of refraction of films 31 and 24 affect the optical characteristics of the light-transmissive layer they comprise. By adding film 31, the layer comprised of films 24 and 31 can be optically tuned. In that tuning, optical interference effects can be employed to reduce reflection of particular wavelength ranges of the electromagnetic spectrum. Use of optical interference effects in thin films is well understood in the art. Film 31 may be composed of one or more strata of a number of light-transmissive materials such as silicon dioxide, silicon nitride, magnesium fluoride or calcium fluoride. Single or multiple overlying, anti-reflection films can also be used with the devices of FIGS. 1 and 3.

A third embodiment 50 of an ultraviolet detector is shown in cross section in FIG. 3. Detector 50 includes a crystalline silicon substrate 13 with a deposited metal contact 36 to which terminal 11 is electrically attached. Contact 36 may be an aluminum film annealed to form an ohmic contact and/or back surface field reflector. Amorphous silicon body 20 is a film of a particular conductivity type. Silicon substrate 13 is of the opposite conductivity type from body 20 so that a rectifying junction is established between them. A conductive oxide layer 24 is disposed on amorphous body 20.

Like films 24 in detectors 10 and 30, light-transmissive film 24 in detector 50 is no more than 50 nm thick and is preferably about 15 to 30 nm in thickness. Because doping efficiencies in amorphous silicon are higher than in crystalline silicon, body 20 can be relatively thin, about 10 nm, without sacrifice in performance. The thinness of body 20 reduces light absorption so that overall performance is improved over a totally crystalline detector. As described in connection with detectors 10 and 30, it is preferred that body 20 in detector 50 be microcrystalline silicon to lower its light absorption compared to that of totally disordered amorphous silicon. Body 20 may also contain a bandgap increasing agent such as carbon or nitrogen. Body 20 may be heavily doped to form a p+ or n+ region. Most preferably, body 20 is a microcrystalline n+ region and substrate 13 is a p-type silicon.

As already described, body 20 may contain pyramidal facets or grooves in order to improve performance. These textures aid in the capture of incident light by producing multiple reflections that ultimately direct light into the substrate that would otherwise be lost. These textures can be formed as described above in connection with FIG. 2.

A particular advantage of the amorphous/crystalline silicon embodiment 50 of the invention lies in its wide spectral response range. Because crystalline silicon has an inherent red response, the amorphous/crystalline silicon device has a response that extends from the ultraviolet, through and beyond the visible range. This embodiment is a wide spectral response electromagnetic energy detector.

Amorphous silicon photovoltaic devices having two general structures, both similar to devices 10 and 30, yet substantially different from the present invention, have been employed for sometime for converting sunlight to electricity. However, both of those known types of solar photovoltaic devices are unsatisfactory as ultraviolet light detectors.

One type of those solar cells uses an opaque substrate on which an amorphous silicon P-I-N device is disposed. Those devices generally include a relatively thick ITO contact. That front contact is at least 60 nm in thickness and usually is thicker. This relatively thick film is employed to reduce resistive current collection losses that can be experienced in thin films and to avoid optical interference effects in the visible light spectrum. However, the ultraviolet light absorption characteristics of ITO prevent efficient transmission of the incident ultraviolet light through layers 60 nm or more in thickness. Ultraviolet light absorbed in the front contact cannot enter these devices and therefore cannot generate any useful photovoltaic response to ultraviolet light. The failure of amorphous silicon solar photovoltaic cells of this type as ultraviolet light detectors is demonstrated in FIG. 4.

The other known amorphous silicon solar cell structure conventionally employs a non-quartz glass substrate, a tin oxide film and a P-I-N structure, receiving light in that order. Because the conventional glass substrate and tin oxide film are, together, strong absorbers of ultraviolet light, little of it can reach the photovoltaically active amorphous silicon.

Figure 4:
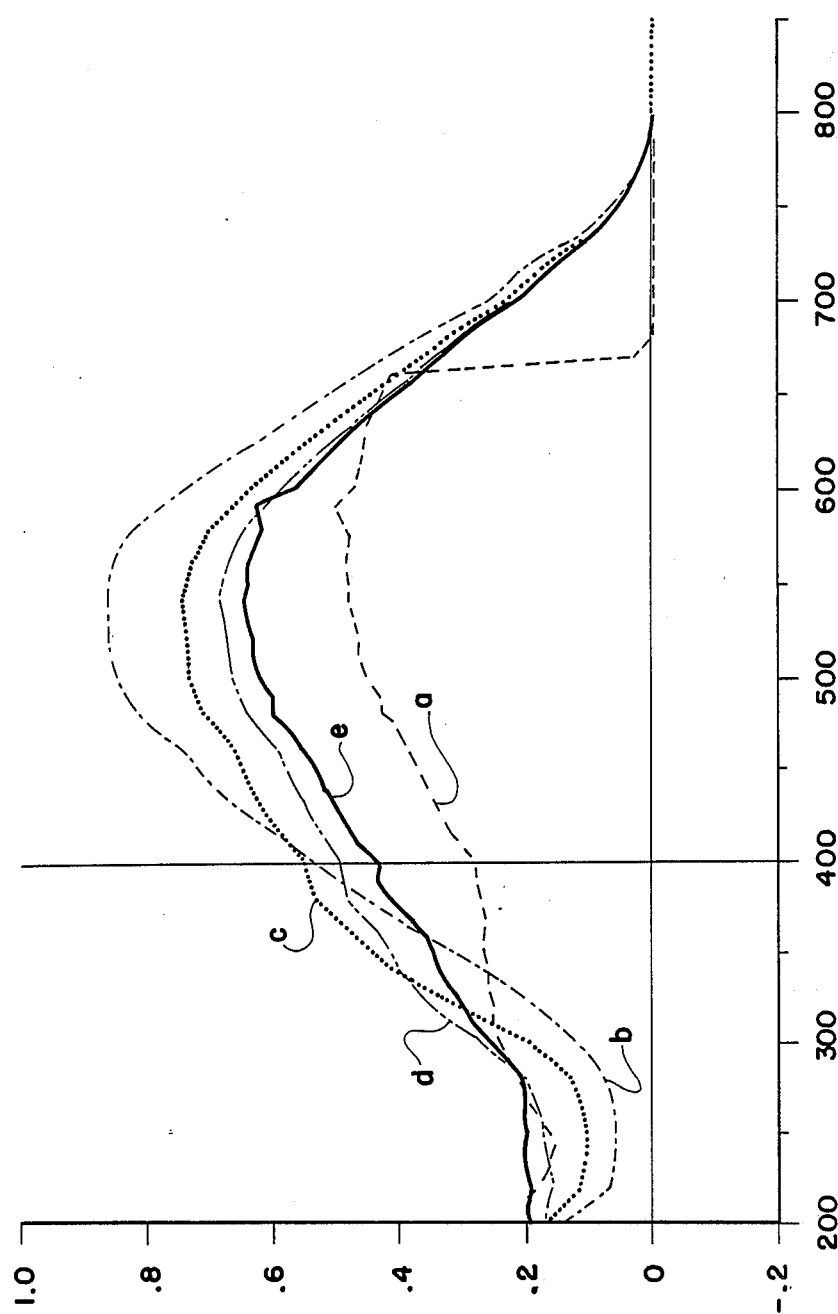
FIG. 4 is a graph of the quantum efficiency as a function of wavelength of various ultraviolet responsive devices including some devices according to the invention.

In FIG. 4, the measured quantum efficiency of various structures is plotted against the wavelength of incident light. These response characteristics were measured by training light of a narrow bandwidth on the various tested devices and scanning the wavelengths of the incident light over the range indicated on the abscissa, namely from 200 nm to about 800 nm. As noted above, the region of interest is the non-visible ultraviolet light region from 200 nm to 400 nm. The quantum efficiency is plotted on the ordinate in relative terms representing the number of electrons generated for each incident photon. To provide a reference response, the characteristics of a commercially available Schottky barrier, gallium arsenide phosphide ultraviolet detector were measured. That measured reference response is plotted as curve a in FIG. 4. The gallium arsenide phosphide Schottky barrier detector was manufactured in Japan by Hamamatsu.

Photovoltaic structures according to the invention were prepared employing glass substrates coated with tin oxide on which an amorphous silicon body was deposited. The amorphous silicon body was deposited by a conventional glow discharge technique. Regions of n-type, intrinsic and p-type amorphous silicon were deposited in that order. The intrinsic regions deposited ranged from about 250 to about 500 nm in thickness. Because of the light absorption characteristics of amorphous silicon, essentially no more light is absorbed in a 500 nm intrinsic region than is absorbed in a 250 nm intrinsic region. As discussed below, thinner intrinsic region devices exhibit better stability than detectors with thick intrinsic regions.

The response curves of FIG. 4 were obtained from devices having 500 nm thick intrinsic regions. The doped regions were about 10 nm thick. A high quality layer of ITO was deposited on top of the p-type amorphous silicon. The ITO had a resistivity of about $2 \times 10^{-4}$ ohm-cm. Different thicknesses of ITO films as front contact were deposited on the amorphous silicon bodies. In FIG. 4, the response curves correspond to the respective thicknesses of the front contacts:

| Curve | ITO Thickness (nm) |
|---|---|
| b | 50 |
| c | 30 |
| d | 20 |
| e | 12.5 |

Focusing on the responses in the spectral region from 200-400 nm, it can be seen that for over half of that range quantum efficiencies are lower for curves b and c than for the reference gallium arsenide phosphide device, curve a. By contrast, the quantum efficiencies represented by curves d and e are, over the spectral region of interest, substantially the same as or better than that of the reference gallium arsenide phosphide device. Curve c shows quantum efficiencies over the upper half of the spectral range of interest that are so much better than the reference detector that they compensate for the poorer response in the lower half of the range.

Curves c, d and e demonstrate that ultraviolet detectors in accordance with the invention can be constructed providing improved sensitivity and quantum efficiencies compared to that of the reference device, provided the ITO front contact has a thickness not exceeding about 50 nm. Substantially improved quantum efficiencies and sensitivities are achieved if the ITO thickness is about 15 to 30 nm. These results further demonstrate that conventional amorphous silicon photovoltaic cells having ITO front contacts at least 60 nm in thickness are not useful as ultraviolet light detectors.

It is well known that many amorphous silicon devices show changes in performance upon lengthy exposure to solar energy. While the devices of the present invention are generally not directed to the absorption of light from the solar spectrum, an embodiment of the invention was exposed to a standard AM1 simulated solar spectrum. (AM1 solar radiation represents light having the intensity and spectral content reaching the surface of the earth when the sun is positioned at the zenith transmitting its light through a standard atmosphere.) Response curves a and e representing the quantum efficiency of the reference device and of an embodiment of the invention employing an ITO front contact of 125 nm thickness, respectively, are plotted in FIG. 5. These are the same response curves that appear in FIG. 4. The novel device was subjected to 15 hours of AM1 light resulting in a shift of curve e to quantum efficiency curve f of FIG. 5. Some decrease in the quantum efficiency of the device within the spectral region of interest is evident in the shift, but the response remains comparable to that of the reference device.

The device producing curves e and f in FIG. 5 has an intrinsic amorphous silicon region about 500 nm in thickness. In the amorphous silicon art it is believed that the device efficiency decline over time attributed to the so-called Staebler-Wronski effect can be reduced by increasing the electric field in the light-absorbing intrinsic region. One method of increasing the field is reduction of the thickness of that region. A thinner intrinsic region also improves the current collection efficiency because the charge carriers have a shorter distance to travel before collection.

Additional embodiments of the invention having reduced thickness intrinsic regions were prepared. In these devices, the thickness of the intrinsic region within the amorphous silicon body was reduced to about 250 nm. The thickness of the ITO layer was 20 nm. As noted above, very little difference in the quantity of ultraviolet light absorbed in the intrinsic region results when the thickness of that region is reduced to 250 nm from 500 nm.

The quantum efficiencies before and after light exposure are plotted in FIG. 6 for an example of the device having a 250 nm thick intrinsic region. Curve g is the measured quantum efficiency as a function of wavelength for the device, before significant solar light exposure. (Curve a is the efficiency of the reference gallium arsenide phosphide device.) After exposure of the device to AM1 radiation for 30 hours, the efficiency shifted to curve h. Thereafter, the device was exposed to ultraviolet light from a low pressure mercury vapor lamp for 20 hours. This exposure resulted in another shift to efficiency curve to i. Before measurement of curve i, a recalibration of the instrumentation was required. The recalibration introduced a small error that is large enough to account for the small variations between curves h and i. In other words, the device with the 250 nm intrinsic region exhibited a very stable quantum efficiency after extended solar and ultraviolet light exposure.

The measured results of FIGS. 4-6 demonstrate that the invention provides a photovoltaic ultraviolet responsive device having quantum efficiencies and stability as good as or better than those of existing commercial devices, and at lower cost. The ultraviolet detector performs well because its front contact oxide film is kept very thin. The long term stability of the detector is enhanced in a P-I-N structure embodiment by minimizing the thickness of the intrinsic region.

The invention has been described with respect to certain preferred embodiments. Various modifications and additions within the spirit of the invention will occur to those of skill in the art. Accordingly, the scope of the invention is limited solely by the following claims.

I claim:

1. A photovoltaic device responsive to incident energy in the ultraviolet range of the electromagnetic spectrum comprising:
an at least partially electrically conductive layer, a body of amorphous silicon disposed on said layer, and a thin film of an electrically conductive, light-transmissive oxide for receiving incident light disposed on said amorphous body opposite said layer, said light-transmissive oxide film having a thickness of less than about 30 nm.

2. The device of claim 1 wherein said oxide film is chosen from the group consisting of indium oxide doped with tin and tin oxide.

3. The photovoltaic device of claim 1 wherein said oxide layer has a thickness of at least about 15 nm.

4. The device of claim 1 wherein said body of amorphous silicon includes an essentially intrinsic region sandwiched between p-type and n-type regions, said three regions being disposed on said layer for serial passage of light through them.

5. The device of claim 4 wherein said intrinsic region has a thickness of no more than about 500 nm.

6. The device of claim 4 wherein said intrinsic region has a thickness of no more than about 250 nm.

7. The device of claim 4 wherein the region of said amorphous silicon body in contact with said oxide film comprises microcrystalline amorphous silicon.

8. The device of claim 4 wherein the region of said amorphous silicon body in contact with said oxide film contains a bandgap increasing agent consisting of one of carbon and nitrogen.

9. The device of claim 1 wherein said layer comprises a substrate providing mechanical support for the device.

10. The device of claim 9 wherein said substrate comprises glass coated with an electrically conducting film.

11. The device of claim 9 wherein said substrate is selected from the group consisting of metals, metallic alloys, and silicon.

12. The device of claim 1 wherein said body of amorphous silicon comprises a doped film of one of p-type and n-type conductivities and said layer is crystalline silicon doped oppositely from said amorphous silicon.

13. The device of claim 12 wherein said doped amorphous silicon film is n-type and said crystalline silicon is p-type.

14. The device of claim 12 wherein said amorphous silicon film is microcrystalline silicon.

15. The device of claim 12 wherein said amorphous silicon film contains a bandgap increasing agent consisting of one of carbon and nitrogen.

16. The device of claim 1 including a second transparent film disposed on said oxide film opposite said amorphous silicon body for altering the optical interference characteristics of said oxide film alone.

17. The device of claim 16 wherein said second transparent film is selected from the group consisting of silicon dioxide, silicon nitride, magnesium fluoride, and calcium fluoride.

18. The device of claim 16 including a third transparent film disposed on said second transparent film opposite said oxide film for altering the optical interference characteristics of said oxide film and second transparent film together.

19. The device of claim 1 including a metallic current collector disposed on a portion of the oxide film.

20. The device of claim 1 including an ultraviolet light-transmitting glass substrate contacting said oxide film.

21. The device of claim 20 wherein said glass substrate is quartz.

22. The device of claim 20 wherein said oxide film is tin oxide.

23. The device of claim 20 wherein said body of amorphous silicon includes an essentially intrinsic region sandwiched between p-type and n-type regions, said three regions being disposed on said film for serial passage of light through them.

24. The device of claim 23 wherein the region in contact with said oxide film contains a bandgap increasing agent consisting of one of carbon and nitrogen.

25. The device of claim 23 wherein said intrinsic region has a thickness of no more than about 500 nm.

26. The device of claim 23 wherein said intrinsic region has a thickness of no more than about 250 nm.

27. The device of claim 20 including a second transparent film disposed on said substrate opposite said oxide film for altering the optical interference characteristics of said glass substrate alone.

28. The device of claim 27 wherein said second transparent film is selected from the group consisting of magnesium fluoride and calcium fluoride.

29. The device of claim 27 including a third transparent film disposed on said second transparent film opposite said glass substrate for altering the optical interference characteristics of said glass and second transparent film together.

* * * * *